United States Patent [19]

Yoshimura

[11] Patent Number: 5,479,357
[45] Date of Patent: Dec. 26, 1995

[54] CIRCUIT DESIGNING SYSTEM

[75] Inventor: Osamu Yoshimura, Tokyo, Japan

[73] Assignee: NEC Corporation, Tokyo, Japan

[21] Appl. No.: 332,724

[22] Filed: Nov. 1, 1994

[30] Foreign Application Priority Data

Nov. 1, 1993 [JP] Japan .................................. 5-273349

[51] Int. Cl.⁶ .................................................. G06F 17/50
[52] U.S. Cl. ............................................ 364/489; 364/488
[58] Field of Search .................................... 364/488, 489, 364/490, 578; 395/500

[56] References Cited

U.S. PATENT DOCUMENTS

| | | | |
|---|---|---|---|
| 4,441,207 | 4/1984 | Lougheed et al. | 364/489 |
| 4,510,616 | 4/1985 | Lougheed et al. | 364/489 |
| 5,293,327 | 3/1994 | Ikeda et al. | 364/578 |
| 5,359,534 | 10/1994 | Fujiki et al. | 364/489 |
| 5,367,469 | 11/1994 | Hartoog | 364/491 |
| 5,383,132 | 1/1995 | Shinohara et al. | 364/491 |

*Primary Examiner*—Vincent N. Trans
*Attorney, Agent, or Firm*—Foley & Lardner

[57] ABSTRACT

A circuit designing system improves precision of fan out checking and further improves reasonableness of construction and consistency of derivation of a wiring capacity. Therefore, wiring lengths of respective wiring connected to respective output terminals of the circuit element of an objective circuit to be designed is predicted on the basis of a circuit design information and the wiring capacity is derived on the basis of the predicted wiring length. In the alternative, the wiring capacity is derived on the basis of the wiring length of respective wiring determined as a result of layout designing. The wiring capacity thus derived is used only for fan out checking, but also for logic synthesizing and logic simulation.

10 Claims, 5 Drawing Sheets

CIRCUIT DESIGNING SYSTEM

BACKGROUND OF THE INVENTION

1. Field of the Invention

The present invention relates to a circuit designing system for performing circuit designing, such as for LSI and so forth, on a computer system. More specifically, the invention relates to a circuit designing system which has a design rule checking function for checking whether a result of circuit designing of a semiconductor integrated circuit conforms a design rule or not.

2. Description of the Related Art

Conventionally, in a circuit designing system of the type set forth above, in order to check whether the contents of a circuit diagram data or circuit connection information prepared at a predetermined step (circuit designing step) (hereinafter, these information, i.e. circuit diagram data or circuit connection information, will be referred to as "circuit design information: NETLIST") is prepared according to a preliminarily established design rule or not, a design rule checking device is normally provided.

A design rule checking is performed at a step immediately after preparation of the circuit design information by a circuit diagram editor or logic synthesizing tool and so forth. By performing design rule checking at early stage of designing, a quality of circuit design can be remarkably improved. Also, error or defect of the circuit which tends to be found in the later stage of designing operation (e.g. logic simulation or layout designing and so forth) can be found at earlier timing so as to contribute for shortening of LSI development period.

A process of LSI designing by the conventional design system will be discussed briefly.

At first, the circuit design information including circuit construction information and circuit connection information is prepared by a circuit diagram editor and a logic synthesizing tool and so forth. The content of the prepared circuit design information is checked against a predetermined design rule. If the result of checking shows that no error is found, then, a logic simulation is performed according to the circuit design information. Subsequently, check is performed whether a simulation error is present or not. When layout error, design rule error or simulation and error is caused, the process is returned to a step for information generating the circuit design information. Accordingly, occurrence of error at later stage (for example, layout design than circuit design information preparation) should cause wasting of done steps to cause longer design period.

Amongst, the design ruler checking is particularly important for development of ASIC (Application Specific IC), for which general user is directly in touch with designing and effective for shortening TAT (Trun Around Time).

The circuit designing system typically includes a design rule file storing a preliminarily established design rule, and a design rule checking device having a check control portion for checking whether the circuit design information is prepared in conformance with the design rule.

The check control portion reads the circuit design information and becomes ready state for receiving a check command from an input device. When various check command is input from the input device, the check control portion performs checking operation corresponding to the input command.

Typically, the following items necessary for LSI development are checked through the design rule checking.

(1) Name check: The prepared circuit connection information is utilized by various design environment tools. For these tools, kind of characters, number of characters to be used as name of an external terminal, name of element and so forth, names (keyword) which cannot be used, and so forth are defined. Name check is performed for various names in the circuit connection information of an objective circuit whether those names comply with the defined rule for the name or not.

(2) Prohibited Connection check: Check is performed where connection which a layout tool cannot handle, meaningless connection in the light of the circuit, specified connection for making the circuit meaningful, prohibited connection between elements which should not be connected, are not made.

(3) Forced Connection check: Check is performed whether terminals to be inherently connected for performing test of LSI after fabrication, specified connection for making the connection meaningful in the circuit, combination of terminals to be inherently connected between the elements, are connected in conformance.

(4) Open Short check: Check is performed for properness of terminal held in open state, terminal shorted between power source line and grounding line.

(5) Fan Out check: Since each output terminal is restricted a load capacity to be driven, check is performed whether the output terminals in the circuit connection information is used within a capacity of driving.

Upon performing checking set forth above, check is performed with reference to relevant design rule in the design rule file. The design rule file describes the design rule for respective checking items in detail. Receiving condition of the command and check execution state are output to the output device so that the final result of checking is output to an output file. After outputting the results of checking, the circuit design checking portion becomes ready state for receiving the check command to perform checking sequentially until an end command is input. After completion of necessary checking, a circuit designer performs correction of the circuit connection information as required on the basis of the content of the result outputting file.

On the other hand, associating with progress of the semiconductor device fabrication technology, the package density of the LSI is increasing is has been past a long period where a gate length of a MOS transistor becomes less than or equal to 1 mm to be so-called submicron age. Also, down-sizing of the circuit elements of the LSI is progressed so that the influence of the wiring length between the elements of the LSI becomes more significant.

For example, an input capacity of an input terminal (named H01) and a load driving performance of an output terminal (named N01) of a basic inverter (named F101) of a cell base series CB-C7 (gate length is 0.8 $\mu$), made by NEC Corporation, are H01 Terminal Capacity: 0.110 pf N01 Capacity can be Driven: 3.319 pf.

On the other hand, a capacity of wiring per 1 mm is 0.17 pf. Therefore, the load capacity per 1 mm of the wiring is approximately 1.5 times greater than the terminal capacity of the element per se and thus quite large. In fact, wiring length in LSI exceeds 10 nm at the longest. In such case, the capacity of the wiring capacity becomes equivalent to connection of fifteen inverters (F101) and thus gives significant influence for the LSI. Therefore, it is quite important to accurately perform fan out checking in the design stage.

Also, in order to accurately perform fan out checking, it is inherent to precisely know the length of wiring connected to each circuit element. However, in practice, the actual wiring length cannot be known precisely until layout design for the LSI is completed. Accordingly, in the prior art, it is typical to progress designing with deriving the wiring length through prediction.

For performing the foregoing fan out checking by the design rule checking device, it becomes necessary to estimate the wiring lengths between respective elements. That is, the fan out checking is a check for the load capacity driven by each output terminal, which load capacity is a sum of "terminal capacity of the input terminal of the connected circuit element" and "capacity of the wiring to the input terminal of the connected circuit element".

Upon fan out checking by the design rule checking device, as a method for calculating the wiring capacity, the following two methods are typically employed in the prior art.

(A). Simple Method:

This method is a method, in which a predetermined wiring length is preliminarily determined and the capacity corresponding to the predetermined wiring length is added to the input terminal capacity to store in the design rule file. Upon checking, since the wiring capacity is already included in the input terminal capacity of each circuit element, the load capacity of the output terminal can be calculated by only "input terminal capacity of the connected circuit element".

In fan out checking employing this method, one of the output terminals as object for checking is extracted and then the input terminal capacity of the circuit element connected to the objective output terminal is read out from the design rule file. Next, the load driving performance value of the objective output terminal is read out from the design rule file, Thereafter, the value of the input terminal capacity and the value of the load driving performance of the objective output terminal are compared to perform fan out checking. The foregoing process is performed for all of the output terminals in the circuit design information.

(B) Predicting method:

This is a method for predicting the wiring length within the system. By performing prediction of the wiring length per each output terminal, per macro unit, or uniformly for all output terminals, the predicted value is added as a load for the corresponding output terminal. Different from the simple method, the input terminal capacity of the circuit element is stored in dependently of the capacity of the wiring in the design rule file. Upon fan out checking, the load capacity of the output terminal is calculated as a sum of "input terminal capacity of the connected circuit element" and "wiring capacity corresponding to the predicted wiring length to the input terminal of the connected circuit element".

In fan out checking employing this method, one of the output terminals is extracted as the object for checking. Next, the input terminal capacity of the circuit element to be connected to the objective output terminal is read out from the design rule file. Then, by a predetermined process, the wiring length of the objective output terminal is predicted to calculate the wiring capacity based on the predicted wiring length. Subsequently, by calculating sum of the input terminal capacity value and the predicted wiring capacity to derive the load capacity of the output terminal. The load capacity of the output terminal is then compared with the load driving performance of the objective output terminal. The foregoing process is performed for all of the output terminals in the circuit connection information.

Prediction of the wiring length and calculation of the wiring capacity are required only at the step of design rule checking but also at a step for preparing the circuit design information by the logic synthesizing tool for synthesizing circuit with taking a delay period in consideration of the influence of the wiring capacity and a step for logic simulation for simulating the circuit with taking a delay period in consideration of the influence of the wiring capacity.

In the above-mentioned conventional circuit design system, upon performing the fan out checking by the design rule checking device, if incorporation of the factor of the wiring capacity is done by employing the foregoing simple method, since the wiring capacity at the predetermined wiring length is incorporated, precise fan out checking cannot be performed. On the other hand, when incorporation of the factor of the wiring capacity is done by employing the foregoing prediction method, while precision of fan out checking is increased, is unreasonable to perform prediction of the wiring length and calculation of the wiring capacity for the same circuit respectively at the design rule checking step, the circuit connection information preparation step by the logic synthesizing tool, and the logic simulation step.

Also, in view of consistency of wiring length prediction in the design flow, it is necessary that the predicted values at respective steps are completely consistent with each other. Therefore, when wiring length prediction method is modified in one tool (step), it inherently requires modification in other tools performing prediction of the wiring length. This makes design flow construction complicate.

Furthermore, the actual wiring length cannot be finally checked with the wiring length after completion of the layout designing.

SUMMARY OF THE INVENTION

It is a first object of the present invention to provide a circuit designing system which can improve precision of fan out checking, can eliminate necessity of redundant calculation of wiring length in logic synthesis other than design rule checking, can make construction reasonable and improve consistency of calculation of wiring capacity to facilitate establishment of design flow by unifying wiring capacity deriving means.

A second object of the present invention is to provide a circuit designing system which permits final fan out checking with a wiring capacity derived on the basis of a wiring length after completion of layout designing, which wiring length is close to an actual wiring length.

In order to accomplish the above-mentioned object, according to one aspect of the invention, a circuit designing system comprises:

circuit design information generating means for generating a circuit design information including a construction information and circuit connection information of an objective circuit to be designed;

wiring capacity calculating means for deriving wiring capacities of all wirings connected to output terminals of respective circuit elements in the circuit design information;

design rule checking means for checking whether the content of the circuit setting information is consistent of a preliminarily defined design rule;

logic simulation means for performing predetermined logic simulation on the basis of the wiring design information and the wiring capacity from the wiring capacity calculating means;

layout designing means for performing layout designing for the objective circuit to be designed on the basis of the circuit design information;

the circuit design information generating means including logic synthesizing means for performing predetermined logic synthesizing on the basis of the wiring capacity from the wiring capacity calculating means and generating predetermined information of the circuit designing information;

the design rule checking means including design rule storage means for storing a load driving performance of respective output terminals of circuit elements in the circuit design information and storing the set value; and fan out checking means for checking whether a load capacity derived by summing the input capacities and the wiring capacities for all circuit elements connected to the output terminal with respect to the output terminals of respective circuit elements in the circuit design information, and whether the load capacity is within a given value range of the load driving performance in the corresponding output terminal.

The circuit designing system may further comprises:

wiring capacity storage means for strong wiring capacities per output terminals of respective circuit elements derived, derived by the wiring capacity calculating means.

The wiring capacity calculating means may derive the wiring capacity by predicting the wiring lengths of all wiring connected to the output terminals of respective circuit elements included in the circuit designing information, on the basis of the circuit connection information included in the circuit designing information.

The fan out checking means of the design rule checking means may sum the input terminal capacity includes in the design rule and the wiring capacity derived by the wiring capacity calculating means, and compare the value of the sum with a load driving performance value of the objective output terminal included in the design rule for checking whether the sum value satisfies the load driving performance.

The wiring capacity calculating means may calculate the wiring capacity on the basis of the wiring length of respective wiring of the result of layout designing.

The wiring capacity calculating means may predict the wiring length of all of wirings connected to the output terminals of each circuit element included in the circuit design information, and include a function for deriving the wiring capacity on the basis of the wiring length of each wiring of the result of layout designing by the layout designing means.

According to another aspect of the invention, a method for designing a circuit comprising the steps of:

generating a circuit design information including a construction information and circuit connection information of an objective circuit to be designed;

deriving wiring capacities of all wirings connected to output terminals of respective circuit elements in the circuit design information;

for checking whether the content of the circuit setting information is consistent of a preliminarily defined design rule;

performing predetermined logic simulation on the basis of the wiring design information and the wiring capacity from the wiring capacity calculating means;

performing layout designing for the objective circuit to be designed on the basis of the circuit design information;

the design rule checking step including design rule storage step for storing a load driving performance of respective output terminals of circuit elements in the circuit design information and storing the set value; and fan out checking step for checking whether a load capacity derived by summing the input capacities and the wiring capacities for all circuit elements connected to the output terminal with respect to the output terminals of respective circuit elements in the circuit design information, and whether the load capacity is within a given value range of the load driving performance in the corresponding output terminal.

Other objects, features and advantages of the present invention will become apparent from the detailed description given hereinafter.

BRIEF DESCRIPTION OF THE DRAWINGS

The present invention will be understood more fully from the detailed description given hereafter and from the accompanying drawings of the preferred embodiment of the present invention, which, however, should not be taken to be limitative to the present invention, but are for explanation and understanding only.

In the drawings.

DESCRIPTION OF THE PREFERRED EMBODIMENT

The preferred embodiments of a circuit designing system according to the present invention will be discussed in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
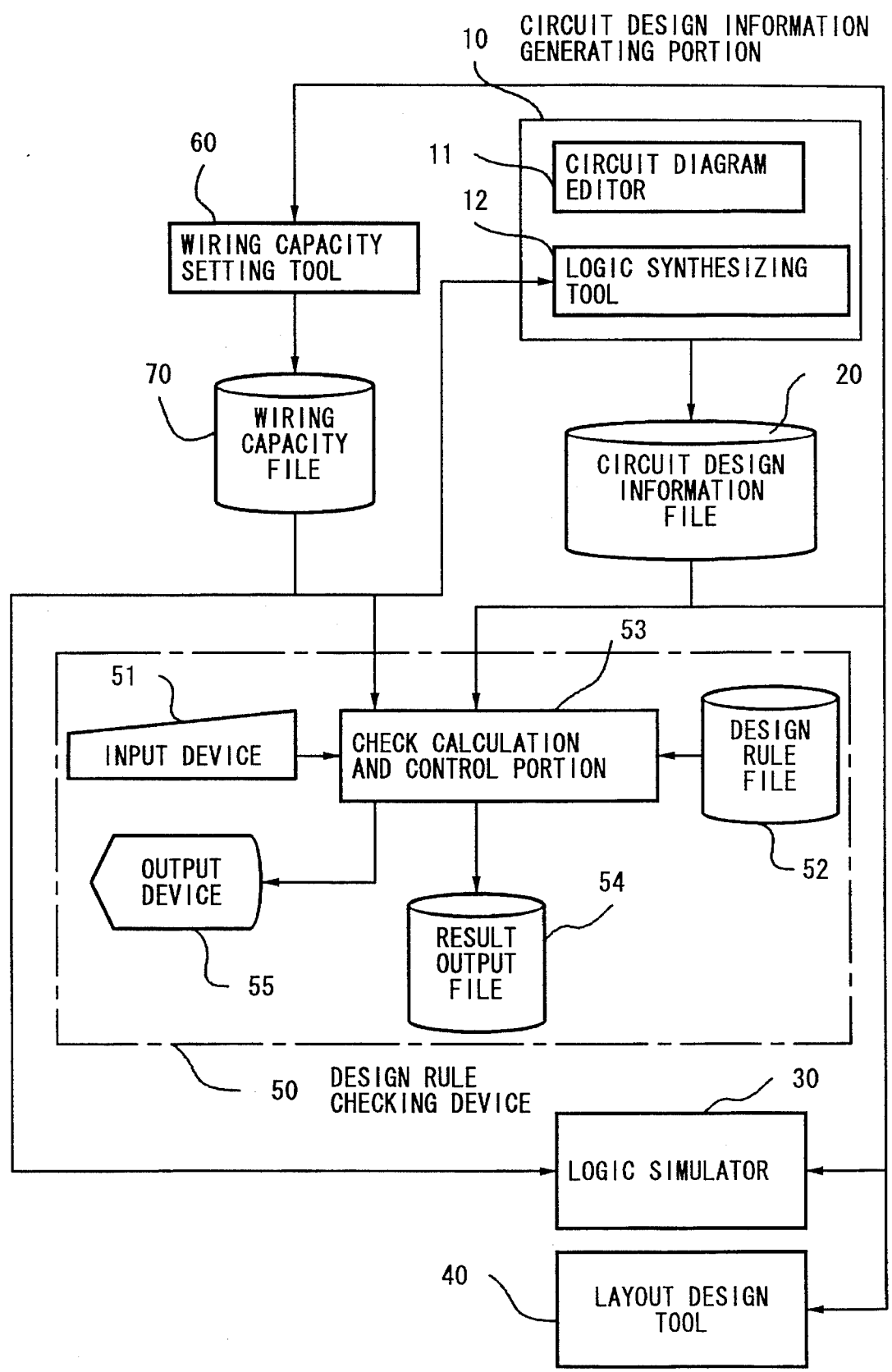
FIG. 1 is a block diagram showing a construction of the first embodiment of a circuit designing system according to the present invention.

FIG. 1 is a block diagram showing a construction of the first embodiment of a circuit designing system according to the present invention. The shown embodiment of a circuit designing system comprises a circuit design information generating portion 10 for generating a circuit design information including a construction information and circuit connection information of an objective circuit to be designed, a circuit design information file 20 storing the circuit design information generated by the circuit design information generating portion 10, a logic simulator for performing logic simulation with respect to the objective circuit for designing on the basis of the circuit design information and a wiring capacity information, a layout design tool 40 for performing layout designing of the objective circuit to be designed on the basis of the circuit design information, a design rule checking device 50, a wiring capacity deriving tool 60 and a wiring tool capacity file 70.

The circuit connection information included in a circuit design information generated by the circuit design information generating portion 10 includes the detailed content of connecting conditions of respective circuit elements. Also, the circuit design information generating portion 10 is a tool for permitting an operator to directly prepare a circuit diagram. The logic synthesizing tool 12 is a tool for generating data of the circuit diagram by performing logical synthesis on the basis of a specification of the circuit. The logic synthesizing tool 12 also generates and corrects predetermined information in the circuit connection information by predetermined logic synthesis on the basis of wiring capacity from a wiring capacity setting tool 60.

The wiring capacity setting tool 60 predicts a wiring length of all wirings connected to output terminals of respective circuit elements included in the circuit design information on the basis of the circuit connection information and derives wiring capacities thereof. The wiring capacity setting tool 60 predicts the wiring capacity from the circuit connection information according to the prediction method discussed above.

The wiring capacity file 70 stores the wiring capacities of respective output terminals of the circuit elements derived by the wiring capacity setting tool 60.

The design rule checking device 50 includes an input device 51, a design rule file 52, a check calculation and control portion 53, a result output file 54 and an output device 55.

The design rule file 52 stores load driving performances of the output terminals of respective circuit elements in the circuit connection information and the design rule including information of input terminal capacities of all circuit elements.

The check calculation and control portion 53 has various design check functions including fan out checking function for checking load capacities derived by summing the input terminal capacities of all circuit elements connected to respective output terminals and the wiring capacities with respect to each of the output terminals of the circuit elements in the circuit connection information on the basis of the circuit connection information, the wiring capacities from the wiring capacity file 70 and the design rule from the design rule file 52.

The input device 51 inputs various check commands to the check calculation and control portion 53. The result output file 54 stores the check results by the check calculation and control portion 53. The output device 55 displays operating condition and the result of check of the check calculation and control portion 53.

Figure 2:
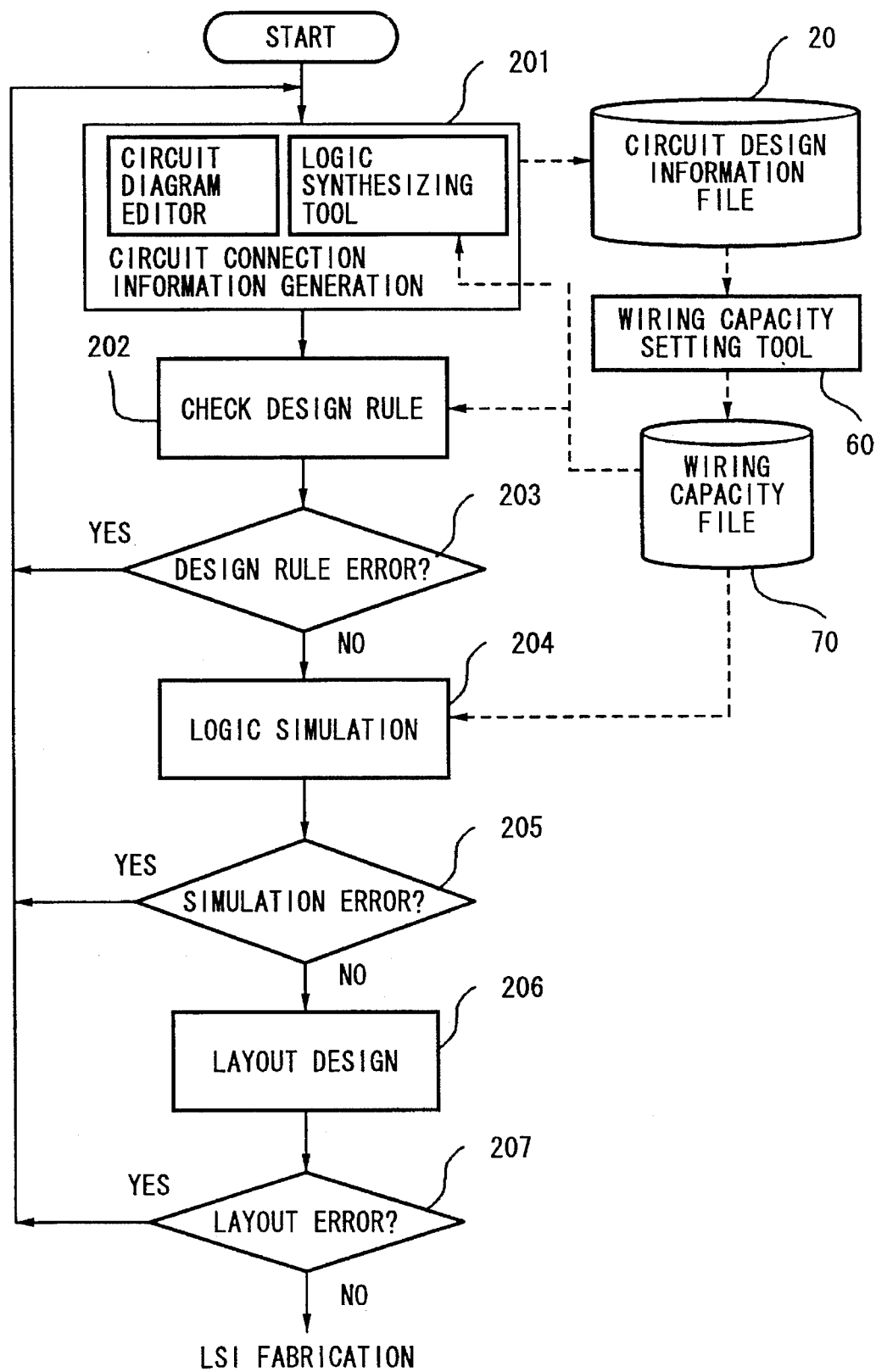
FIG. 2 is a flowchart showing a designing process for explaining operation of the embodiment shown in FIG. 1.

Next, process of the circuit (e.g. LSI) designing of the shown embodiment will be discussed according to the flowchart of FIG. 2.

By a circuit diagram editor 11 of the circuit design information generating portion 10 or the logic synthesizing tool 12, the circuit design information including the circuit construction of the objective circuit for designing and the circuit connection information (step 201). The generated circuit design information is stored in the circuit design information file 20. Also, in the wiring capacity setting tool 60, respective wiring lengths of all wirings connected to the output terminals of respective circuit elements included in the circuit design information are predicted. On the basis of the predicted wiring lengths, wiring capacities are calculated. The calculated wiring capacities are stored in the wiring capacity file 70.

In the check calculation and control portion 53 of the design rule checking device, the generated circuit design information is read out from the circuit design information file 20. Then, the content of the circuit design information is checked on the basis of the predetermined design rule (steps 202 and 203). At this time, the wiring capacity information is read out from the wiring capacity file 70. Then, on the basis of the read out wiring capacity information, fan out check which will be discussed later is performed.

As a result of design rule checking, if no error is found, the generated circuit design information is read out from the circuit design information file 20 and the wiring capacity information is read out from the wiring capacity file 70 in the logic simulator 30. On the basis of the circuit design information and the wiring capacity information read out as set forth above, logic simulation is performed (step 204). Also, at this time, simulation error is checked (step 205).

At the step 205, when no simulation error is found, the layout designing is performed in the layout designing tool 40 (step 206). When the layout design is done, with respect to the content of the layout design, layout error is checked (step 207). Then, if no layout error is found, the process is moved to an LSI production process.

In the flow of the foregoing circuit design, when any one of design rule error, simulation error or layout error is caused, the process is returned to the circuit connection information generating step 201. At this time, in the logic synthesizing tool 12 of the circuit design information generating portion 10, correction of the predetermined information in the circuit design information is performed by performing logic synthesis on the basis of the wiring capacity derived by the wiring capacity calculation tool 60 and stored in the wiring capacity file 70.

The check calculation and control portion 53 reads out the stored information from the circuit design information file 20 and the wiring capacity file 70 to be in the ready state for receiving the check command to be input from the input device 32. When various check command is input from the input device 51, checking operation corresponding to the input command is performed. Here, inherent checking for development of the LSI is performed. Namely, here, name checking, prohibit connection checking, forced connection check, open and short checking, fan out checking are performed.

For executing checking, check is performed with reference to the relevant design rule in the design rule file 52. In the design rule file 52, as set forth above, the design rule describes the detail of the design rule. The information indicative of the command reception condition or check executing condition are transferred to the output device 55. Results of the final check is output to and stored in the result output file 54. After outputting the check result, the check calculation and control portion 53 again gets ready for reception of the next check command. Thus check is sequentially performed until the end command is input. After completion of necessary check, the circuit designer performs correction of the circuit design information, as required on the basis of the content of the result output file 54. In concrete, in the logic synthesizing tool 12 of the circuit design information generating portion 10, correction for the predetermined information in the circuit design information is performed by performing predetermined logical synthesizing on the basis of the wiring capacity stored in the wiring capacity file 70.

Figure 3:
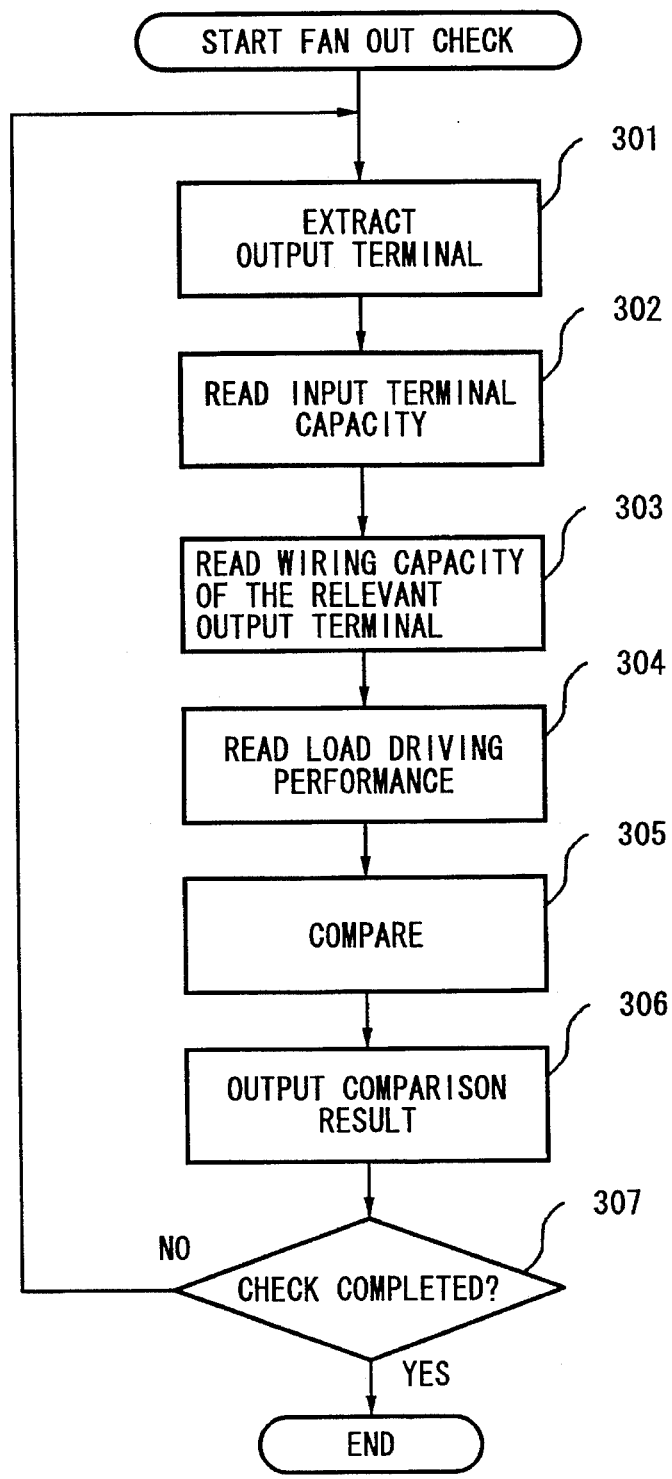
FIG. 3 is a flowchart showing a process of fan out checking process in a design rule checking device in the embodiment of FIG. 1.

The design rule checking device of the circuit designing system according to the shown embodiment performs particular process different from the conventional simple method and prediction method. Hereinafter, discussion will be given for the fan out checking operation of the showing embodiment with reference to the flowchart of FIG. 3.

When the check command for fan out checking is input from the input device 51. Then, the check calculation and control portion 53 initiates checking to extract one output terminal in the circuit connection information included in the circuit design information is extracted (step 301). Next, the input terminal capacity of the circuit element connected to the extracted output terminal is read out from the design rule file 52 (step 302).

Next, the wiring capacity of the relevant output terminal is read out from the wiring capacity file 70 (step 303), In the wiring capacity file 70, the wiring capacity information of all output terminals derived by the wiring capacity setting tool 60 are stored. Next, the load driving performance of the relevant output terminal is read out from the design rule file 52 (step 304).

Then, by summing the input terminal capacity and the wiring capacity, the value of the sum is compared with the load driving performance value of the output terminal (step 305). Result of comparison is written in the result output file 54 as the result of fan out checking (step 306). The foregoing process is performed with respect to all of the output terminals in the circuit connection information (step 307). When process is completed for all of the output terminals, process goes end.

In the foregoing embodiment, since the predicted wiring capacity is calculated with predicting the wiring length connected to respective output terminals by the wiring capacity setting tool 60, precision of fan out checking can be improved in comparison with the simple method, in which the wiring capacity is calculated on the basis of the predetermined wiring length.

Also, since the wiring capacity calculated by the wiring capacity setting tool 60 is adapted to be used not only for fan out checking but also for logic synthesizing tool in the circuit design information generation and logic simulation process, it becomes unnecessary to provide tools for redundant calculation of the predicted wiring length and the wiring capacity for the logic synthesizing tool 12 and the logic simulator 30. Accordingly, construction can be made more reasonable and consistency of calculation of the wiring capacity can be enhanced to facilitate establishment of the design flow.

Figure 4:
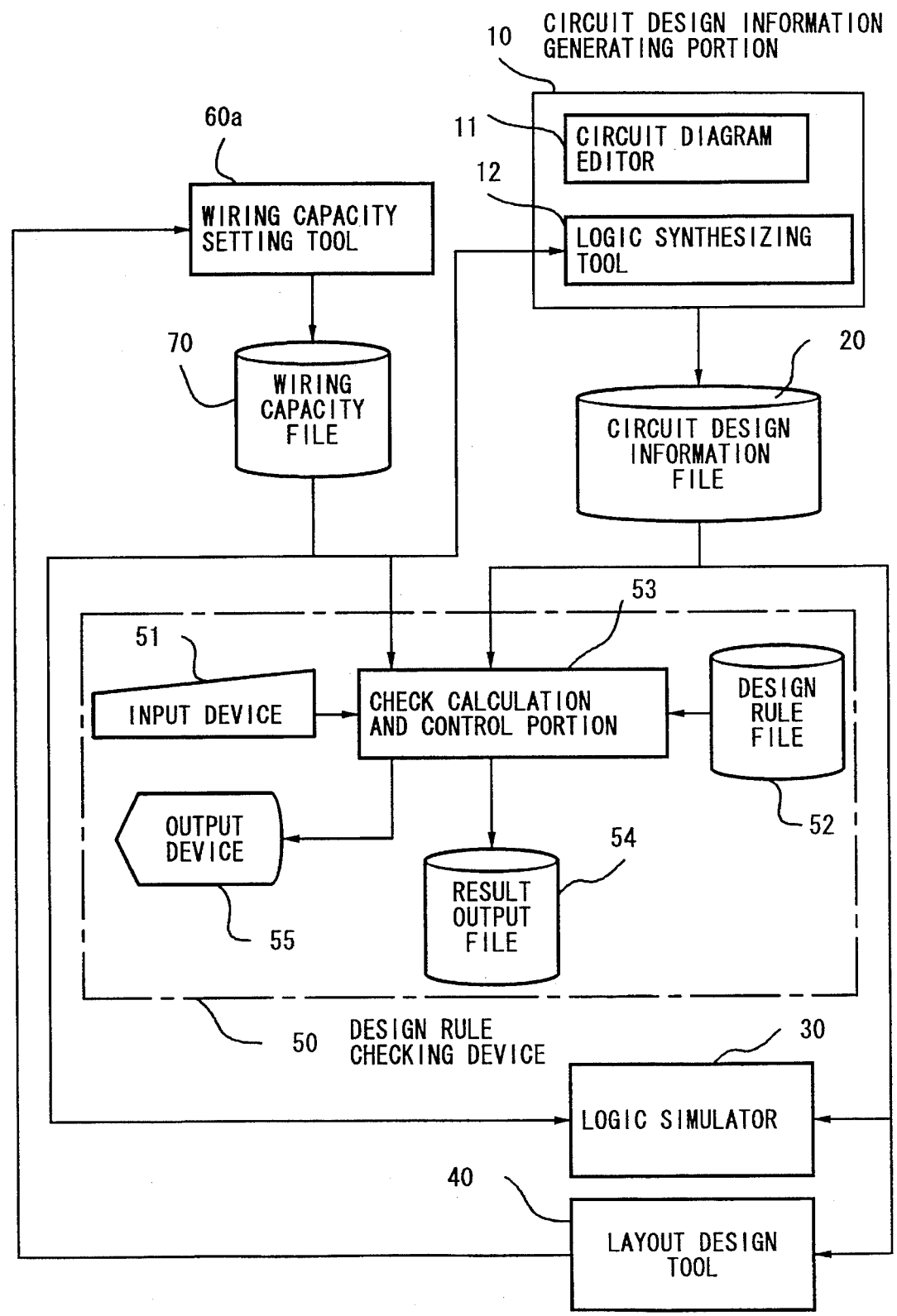
FIG. 4 is a block diagram showing a construction of the second embodiment of a circuit designing system according to the present invention.
Figure 5:
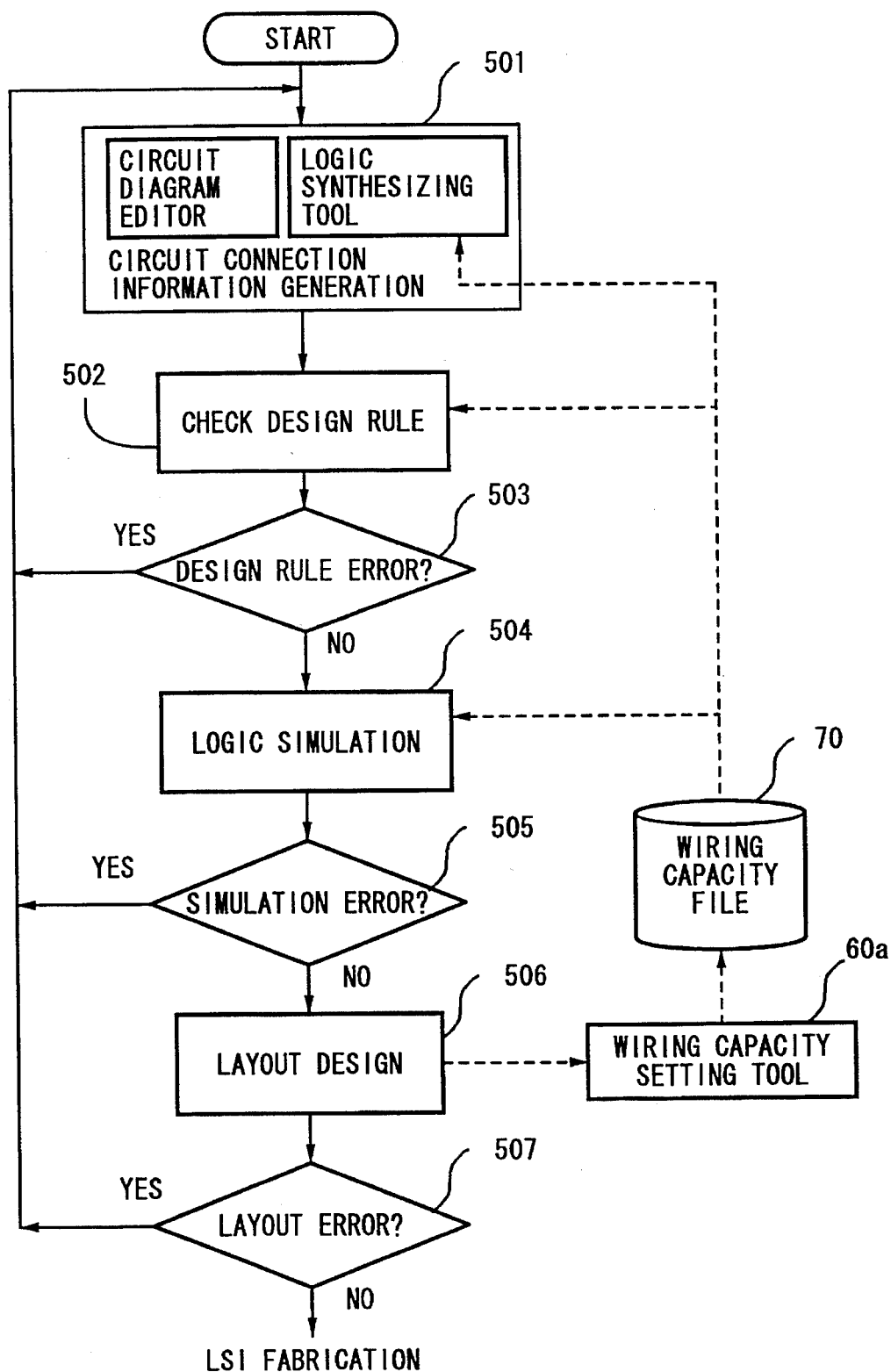
FIG. 5 is a flowchart showing a process of designing for explaining operation of the embodiment of FIG. 4.

FIG. 4 is a block diagram showing the construction of the second embodiment of the circuit designing system according to the present invention. FIG. 5 is a flowchart showing a process step of circuit (e.g. LSI) designing in the second embodiment.

In the second embodiment, a wiring capacity setting tool 60*a* calculates the wiring lengths of the wiring connected to respective output terminals from the result of layout designing by a layout designing tool 40*a*, and then calculates the wiring capacity. The entire construction other than those set forth above are substantially the same as that of the first embodiment of FIG. 1. Therefore, like reference numerals to the foregoing first embodiment will represent substantially the same elements. Also, in FIG. 5, the processes from steps 501 to 507 are the same as those of the steps 201 to 207 of FIG. 2. The process distinguished from that of the first embodiment, is that, in the design rule checking at a step 502, logical simulation at a step 504, the wiring capacity calculation means 60*a* extracts the wiring length from the result of layout designing obtained by the layout designing tool 40*a*, and from the extracted wiring lengths, the wiring capacity is calculated.

Also, the process of the fan out check is the same as that illustrated in FIG. 6.

Accordingly, on the basis of the wiring capacity derived from the wiring length which is substantially close to the actual wiring length, final logic synthesizing, fan out checking, logic simulation can be performed. Even in this embodiment, the advantages similar to the first embodiment can be achieved.

It should be noted that the wiring capacity setting tool 60 can be constructed to have functions of both of the first and second embodiments. In this case, the system construction of FIG. 1 and the system construction of FIG. 4 may be mutually switched for permitting selection of two design processes of FIGS. 2 and 5.

As set forth above, the present invention includes the wiring capacity setting tool for predicting wiring length of the wiring connected to each output terminal and deriving and setting the wiring capacity, and the predicted wiring capacity derived by the wiring capacity setting tool is used for logic synthesizing, fan out checking and logic simulation, precision of fan out checking can be improved. Also, since redundancy of derivation of the wiring capacity is avoided, reasonableness of construction and consistency of wiring capacity calculation and setting can be improved to facilitate establishment of the design flow. Also, by deriving and setting the wiring capacity on the basis of the wiring length from the result of the layout designing, final logic synthesizing, fan out checking and logic simulation based in the wiring capacity derived from the wiring length equivalent to the actual wiring length can be performed.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A method for designing a circuit comprising the steps of:

generating a circuit design information including a construction information and circuit connection information of an objective circuit to be designed;

deriving wiring capacities of all wirings connected to output terminals of respective circuit elements in said circuit design information;

checking whether the content of said circuit connection information is consistent with a preliminarily defined design rule;

performing predetermined logic simulation on the basis of said wiring design information and the wiring capacity;

performing layout designing for the objective circuit to be designed on the basis of said circuit design information;

said design rule checking step including design rule storage step for storing a load driving performance of respective output terminals of circuit elements in said circuit design information; and fan out checking step for checking whether a load capacity derived by summing input capacities and said wiring capacities for all circuit elements connected to an output terminal with respect to the output terminals of respective circuit elements in said circuit design information, and whether the load capacity is within a given value range of the load driving performance in the corresponding output terminal.

2. A method for designing a circuit as set forth in claim 1, wherein in said wiring capacity calculating step, the wiring capacity is derived by predicting the wiring lengths of all wiring connected to the output terminals of respective circuit elements included in said circuit designing information on the basis of the circuit connection information included in said circuit designing information.

3. A method for designing a circuit as set forth in claim 1, wherein said fan out checking step sums the input terminal capacity included in said design rule and the wiring capacity, and the sum is compared with a load driving performance value of the objective output terminal included in said design rule for checking whether the sum satisfies the load driving performance.

4. A method for designing a circuit as set for in claim 1, wherein in said wiring capacity calculating step, the wiring capacity is calculated on the basis of the wiring length of respective wiring of the result of layout designing.

5. A circuit designing system comprising:
   circuit design information generating means for generating a circuit design information including a construction information and circuit connection information of an objective circuit to be designed;
   wiring capacity calculating means for deriving wiring capacities of all wirings connected to output terminals of respective circuit elements in said circuit design information;
   design rule checking means for checking whether the content of said circuit connection information is consistent with a preliminarily defined design rule;
   logic simulation means for performing predetermined logic simulation on the basis of said circuit design information and the wiring capacity from said wiring capacity calculating means;
   layout designing means for performing layout designing for the objective circuit to be designed on the basis of said circuit design information;
   said circuit design information generating means including logic synthesizing means for performing predetermined logic synthesizing on the basis of the wiring capacity from said wiring capacity calculating means and generating predetermined information of said circuit designing information;
   said design rule checking means including
   design rule storage means for storing a load driving performance of respective output terminals of circuit elements in said circuit design information; and
   fan out checking means for checking whether a load capacity derived by summing input capacities and said wiring capacities for all circuit elements connected to an output terminal with respect to the output terminals of respective circuit elements in said circuit design information, and whether the load capacity is within a given value range of the load driving performance in the corresponding output terminal.

6. A circuit designing system as set forth in claim 1 which further comprises:
   wiring capacity storage means for storing wiring capacities per output terminals of respective circuit elements, said wiring capacities derived by said wiring capacity calculating means.

7. A circuit designing system as set forth in claim 5, wherein said wiring capacity calculating means derives the wiring capacity by predicting the wiring lengths of all wiring connected to the output terminals of respective circuit elements included in said circuit designing information, on the basis of the circuit connection information included in said circuit design information.

8. A circuit designing system as set forth in claim 5, wherein said fan out checking means of said design rule checking means sums the input terminal capacity included in said design rule and the wiring capacity derived by said wiring capacity calculating means, and compares the sum with a load driving performance value of the objective output terminal included in said design rule for checking whether the sum satisfies the load driving performance.

9. A circuit designing system as set for in claim 5, wherein said wiring capacity calculating means calculates the wiring capacity on the basis of the wiring length of respective wiring of the result of layout designing.

10. A circuit designing system as set forth in claim 5, wherein said wiring capacity calculating means predicts the wiring length of all of wirings connected to the output terminals of each circuit element included in said circuit design information, and includes a function for deriving the wiring capacity on the basis of the wiring length of each wiring of the result of layout designing by said layout designing means.

* * * * *